(12) United States Patent
Lin et al.

(10) Patent No.: US 8,446,731 B2
(45) Date of Patent: May 21, 2013

(54) REMOVABLE DEVICE AND METHOD FOR ESTABLISHING ESD PROTECTION THEREON

(75) Inventors: Shu-Chin Lin, New Taipei (TW); Ming-Hong Hsiao, Taipei (TW); Chia-Ming Hu, New Taipei (TW)

(73) Assignee: Transcend Information, Inc., NeiHu Dist, Taipei (TW)

(*) Notice: Subject to any disclaimer, the term of this patent is extended or adjusted under 35 U.S.C. 154(b) by 247 days.

(21) Appl. No.: 13/038,393

(22) Filed: Mar. 2, 2011

(65) Prior Publication Data
US 2012/0224336 A1    Sep. 6, 2012

(51) Int. Cl.
*H05K 5/00*    (2006.01)

(52) U.S. Cl.
USPC .......................................... 361/752

(58) Field of Classification Search
None
See application file for complete search history.

(56) References Cited

U.S. PATENT DOCUMENTS

| | | | | |
|---|---|---|---|---|
| 5,941,733 A * | 8/1999 | Lai | | 439/607.01 |
| 6,165,016 A * | 12/2000 | Lai | | 439/607.41 |
| 6,561,421 B1 * | 5/2003 | Yu | | 235/451 |
| 6,676,419 B1 * | 1/2004 | Lin et al. | | 439/76.1 |
| 6,778,401 B1 * | 8/2004 | Yu et al. | | 361/752 |
| 6,873,524 B2 * | 3/2005 | Kaczeus et al. | | 361/679.33 |
| 6,900,988 B2 * | 5/2005 | Yen | | 361/737 |
| 7,104,809 B1 * | 9/2006 | Huang | | 439/76.1 |
| 7,238,053 B1 * | 7/2007 | Liu et al. | | 439/630 |
| 7,252,518 B1 * | 8/2007 | Ni | | 439/76.1 |
| 7,307,849 B2 * | 12/2007 | Ho et al. | | 361/737 |
| 7,359,208 B2 * | 4/2008 | Ni | | 361/752 |
| 7,407,390 B1 * | 8/2008 | Ni | | 439/76.1 |
| 7,410,370 B2 | 8/2008 | Sprouse | | |
| 7,581,967 B2 | 9/2009 | Collantes, Jr. | | |
| 7,733,639 B2 * | 6/2010 | Rambosek et al. | | 361/679.32 |
| 7,810,235 B2 | 10/2010 | Sprouse | | |
| 8,000,104 B2 * | 8/2011 | Kim et al. | | 361/730 |
| 8,102,657 B2 * | 1/2012 | Hiew et al. | | 361/737 |
| 8,102,662 B2 * | 1/2012 | Hiew et al. | | 361/752 |
| 2003/0100203 A1 * | 5/2003 | Yen | | 439/79 |
| 2004/0145875 A1 * | 7/2004 | Yu et al. | | 361/752 |
| 2004/0255313 A1 * | 12/2004 | Kaczeus et al. | | 720/651 |
| 2005/0287852 A1 * | 12/2005 | Sugawara et al. | | 439/135 |
| 2007/0103857 A1 * | 5/2007 | Weech et al. | | 361/683 |
| 2008/0144270 A1 * | 6/2008 | Dal Porto et al. | | 361/684 |
| 2009/0027816 A1 * | 1/2009 | Kim et al. | | 361/56 |
| 2009/0190277 A1 * | 7/2009 | Hiew et al. | | 361/56 |

* cited by examiner

*Primary Examiner* — Hoa C Nguyen
*Assistant Examiner* — Xanthia C Cunningham
(74) *Attorney, Agent, or Firm* — Winston Hsu; Scott Margo

(57) ABSTRACT

For a removable device such as a USB pen drive, two components are relatively moveable with each other by sliding, rotating, or rolling over. When a second component moves with respect to a first component, the clearance between the two components ensures durability of the removable device. As the second component moves to and is configured at an extended position, a first biasing element on the first component abuts and pushed a second biasing element on the second component so that ground nodes of the second component contact with a conductive section of the first component. The ground path way is then established for ESD protection. As the second component moves out of the extend position, the connection between the ground nodes and the conductive section no longer exists and the clearance between the two components exists again.

20 Claims, 10 Drawing Sheets

REMOVABLE DEVICE AND METHOD FOR ESTABLISHING ESD PROTECTION THEREON

BACKGROUND

1. Technical Field

The invention relates to a removable device and a method, and more particularly, to a removable device with ESD protection when inserting into a receptacle and a method for establish ESD protection on the removable device.

2. Description of the Conventional Art

Electronic devices have been designed to have extensive applications by connecting/incorporating to another electronic device. Examples such as external devices, portable devices, or hub devices are provided with a multitude of connecting ports as an access end with another device, either as a host device or as a client device.

Under normal circumstances, some electrostatic charge can develop on the conductive housing which may lead to Electrostatic discharge (ESD) issues. ESD is a discharge of transient charge that may develop on a conductive housing or on a body that is in electrical contact with the housing, causing the housing to be at higher electrical potential with respect to ground requiring a ground path to discharge. Hence many electrical/electronic systems are furnished with ESD protection circuits. These circuits prevent an unwanted transient charge that may develop on a conductive housing from jumping onto sensitive components within the electronic devices and hence prevent the damage or failure of electronic devices. One way to design for ESD protection is to provide a ground path to chassis (PC) ground via a metal shell of a connector.

It is also a trend for miniaturization for electronic devices/removable devices, primarily USB pen drives, which brings about connectors without the metal shell surrounding thereto of an USB pen drive. By using simply a plastic carrier on which signal pins are disposed, the connector of such USB pen drive has reduced dimension. However, the ESD issues still need to be taken care.

SUMMARY

A removable device utilized for inserting into a receptacle of a host is disclosed. The removable device includes a first component and a second component. The first component includes a conductive section. The second component can be selectively configured at a first position and a second position with respect to the first component. The second component includes a biasing element, a circuit board, and a connector. The biasing element is abutted by the first component when the second component is configured at the second position with respect to the first component. The circuit board includes a ground node, wherein the ground node is in connection with the conductive section of the first component when the biasing element is abutted by the first component to bias the second component. The connector is electrically connected to the circuit board. The connector inserts into the receptacle such that the removable device is operatable when the second component is configured at the second position with respect to the first component.

A method for establishing ESD protection on a removable device is also disclosed, which is utilized for inserting into a receptacle of a host. The removable device includes a first component and a second component selectively configured at a first position and a second position with respect to the first component. The method includes steps: moving the second component from the first position to the second position, and a biasing element of the second component being abutted by the first component to bias the second component so that a ground node of a circuit board of the second component has connection with a conductive section of the first component when the second component is at the second position; and inserting a connector electrically connected to the circuit board of the second component into the receptacle such that the removable device is operatable when the second component is configured at the second position with respect to the first component.

The invention also provides a removable device, including a housing and a removable component. The housing has an opening and a conductive section around the opening. The removable component is movable along a direction in the housing and includes a connector and a set of ground nodes relatively arranged to the conductive section of the housing. When the connector is protruded from the opening of the housing, the conductive section is in connection with the set of ground nodes.

The invention also provides a removable device utilized for inserting into a receptacle of a host. The removable device includes a housing and a removable component. The housing includes a conductive section and a biasing element. The removable component is selectively configured at a first position and a second position with respect to the housing. The removable component is abutted by the biasing element when configured at the second position with respect to the housing. The removable component includes a circuit board and a connector. The circuit board includes a ground node, wherein the ground node is in connection with the conductive section of the housing when the removable component is abutted by the biasing element. The connector is electrically connected to the circuit board. The connector inserts into the receptacle such that the removable device is operatable when the removable component is configured at the second position with respect to the housing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
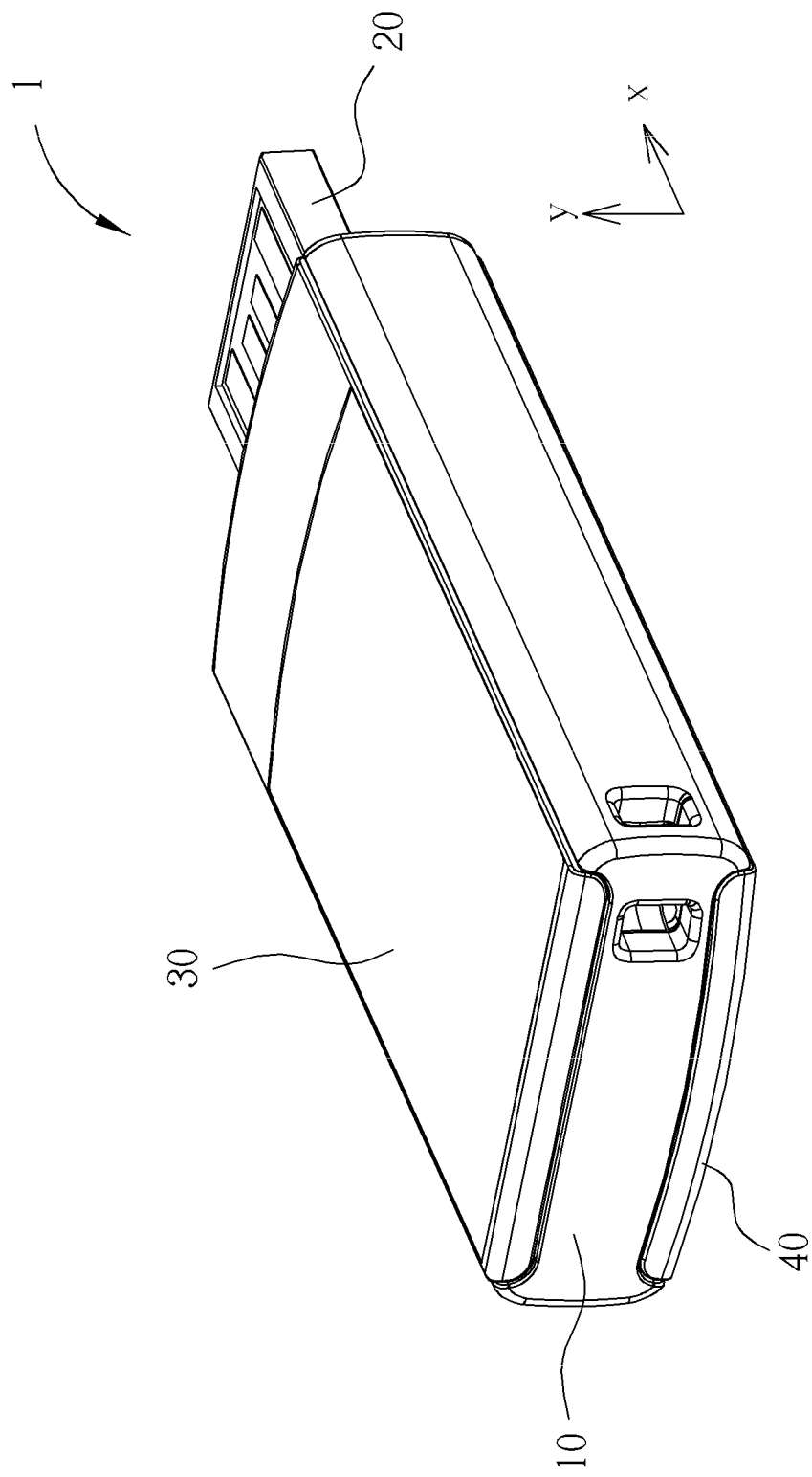
FIG. 1 is a schematic diagram showing a USB pen drive with its connector extending outward to an operatable position.
Figure 2:
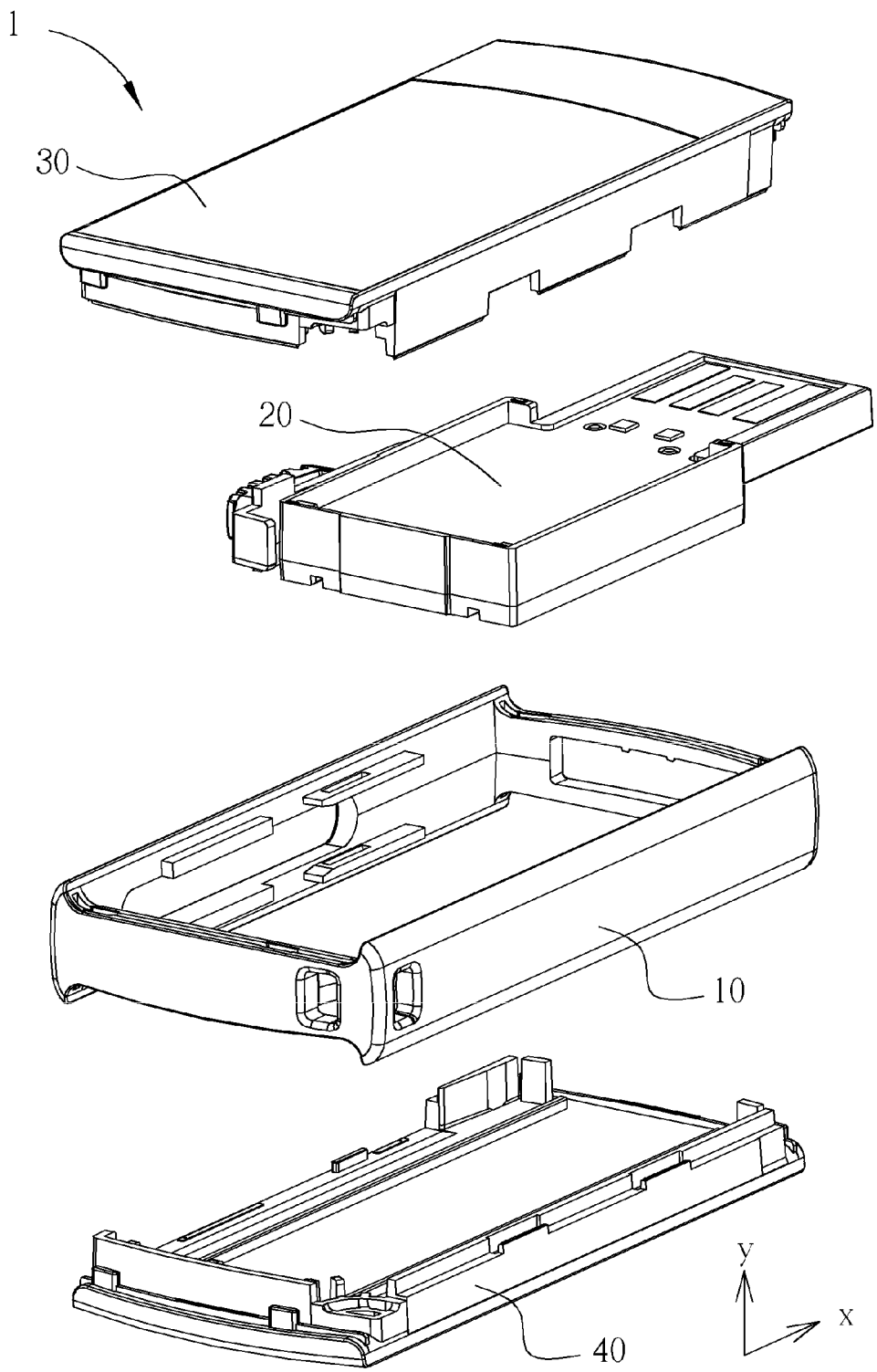
FIG. 2 is a schematic diagram showing an exploded view of each component of the pen drive.

Please refer to FIG. 1 and FIG. 2. FIG. 1 is a schematic diagram showing a USB pen drive with its connector extending outward to an operatable position, and FIG. 2 is a schematic diagram showing an exploded view of each component of the pen drive. The pen drive 1, or a nonvolatile memory unit or any removable device, includes a first component 10 and a second component 20, where the first component 10 may be an outer shell, housing, or frame, for allowing the second component 20, a removable component and the main part of the device that includes circuit board, memory unit, connector, to move therein. With respect to the first component 10, the second component 20 may be selectively configured at a retracted position or an extended position. While at the retracted position, the second component 20 is completely retracted into the first component 10 so that the pen drive 1 may have integral and minimized size for aesthetic or convenient purposes. While the second component 20 extends outwards to the extended position, the pen drive 1 is ready to function, for example, to insert into a receptacle of a host (not shown) and have an established connection with the host. The pen drive 1 also includes a top housing 30 and a bottom housing 40, which can be for decoration purposes or for protection of the second component 20, and can be individual parts or incorporated into the first component 10 as an integral component. In this embodiment shown in FIG. 1 and FIG. 2, the top housing 30 and the bottom housing 40 are assembled together and have coverage around the first component 10, or over the top and bottom planes of the first component 10. While in other embodiments, a component, featured as the first component 10, can also be simply composed by the top housing 30, the first component 10 as a middle component, and the bottom housing 40 to assemble and form a housing with an opening at one side of the middle component that contains conductive material.

Figure 3:
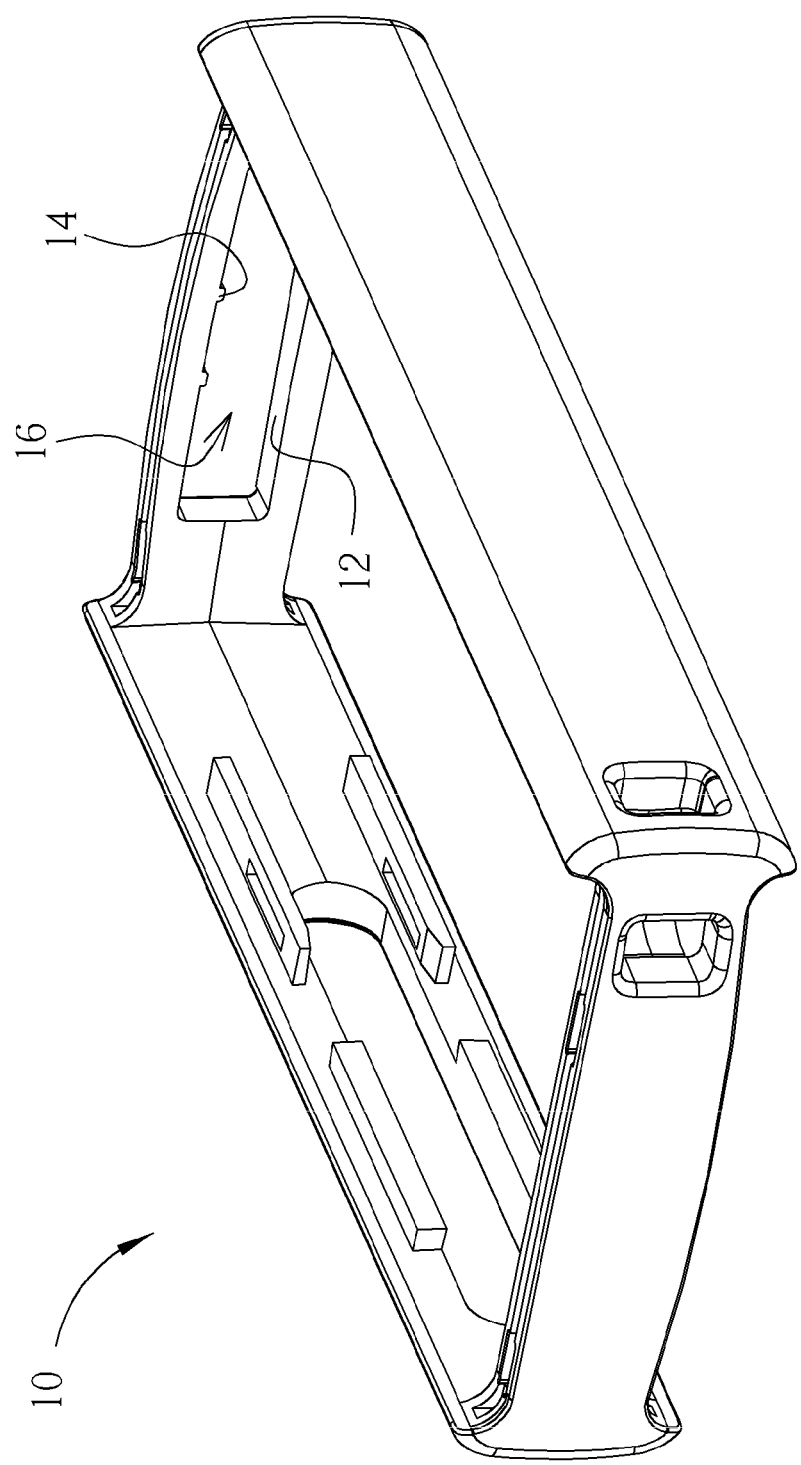
FIG. 3 is a schematic diagram of the first component.

Please refer to FIG. 3, which is a schematic diagram of the first component 10. The first component 10, exemplified as a frame with an opening 16 as one side, is made of metal or non metal material and at least a portion of the first component 10 is electrically conductive. In this embodiment, the first component 10 has at least one conductive section 14, disposed at the perimeter of or around the opening 16, which forms the conductive portion of the first component 10. The first component 10 also has a first biasing element 12, exemplified as a bulge with an inclined surface (referring to FIG. 7 for detailed illustration of the first biasing element 12), which is also disposed at the perimeter of the opening 16.

Figure 4:
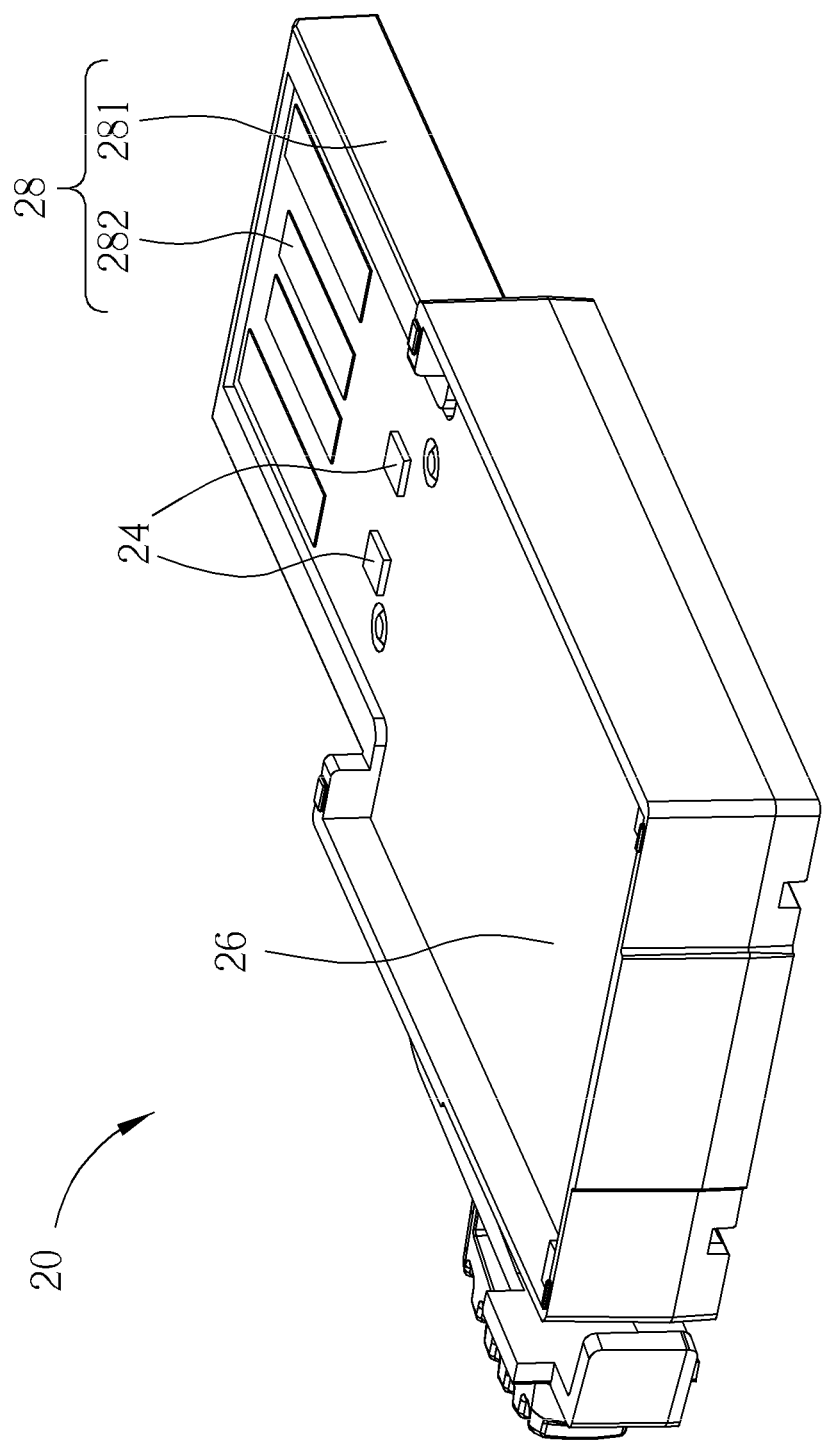
FIG. 4 is a schematic diagram of the second component.

Please refer to FIG. 4, which is a schematic diagram of the second component 20. As mentioned earlier, the second component 20 may be selectively configured at a retracted position or an extended position. In this embodiment, the second component 20 is movable with respect to the first component 10 by sliding therein. In other words, the second component 20 slides to the retracted position or to the extended position with respect to the first component 10. The second component 20 includes a circuit board 26, a connector 28 electrically and physically connected to the circuit board 26. For an exemplary embodiment, the circuit board 26 may include a nonvolatile memory unit 261 (referring to FIGS. 5~8) such that all the components in FIGS. 1~2 function as the pen drive 1. The circuit board 26 may also include some types of control chips, ICs, so as to be implemented to any removable devices, such as wireless communication gadgets, interface convertible devices, hubs, audio/video controller, etc. In this embodiment, the pen drive 1 is used for descriptive purpose. Please keep referring to FIG. 4. The pen drive 1 uses the connector 28 to insert into a receptacle of a host to establish a connection with the host. Hence, the connector 28 is made to interface with the host through a commonly shared standardized interface, say, the Universal Serial Bus (USB) 2.0, 3.0 standards, the IEEE 1394 (Firewire) standard, the e-SATA interface. Mechanical and electrical details of the above-mentioned standards are provided to be easily acquired, learned, and used by those skilled in the art. In the embodiment shown in FIG. 4, or the USB connector 28 to be more specific, the connector 28 includes a carrier 281 and a plurality of contacts 282. The contacts 282 are several electrical nodes disposed on the extension of the circuit board 26 and are configured to follow the requirement released by USB standard. The carrier 281 is made of plastic or a circuit on board (COB) that carries and encloses the contacts 282. Without a metal shell, which is commonly used in a conventional USB connector, the connector 28 is substantially reduced in its thickness. For ESD protection purpose, the circuit board 26 includes a set of ground nodes 24 wired relative to the conductive section 14 of the first component 10 to provide a ground path for any transient charge.

Figure 5:
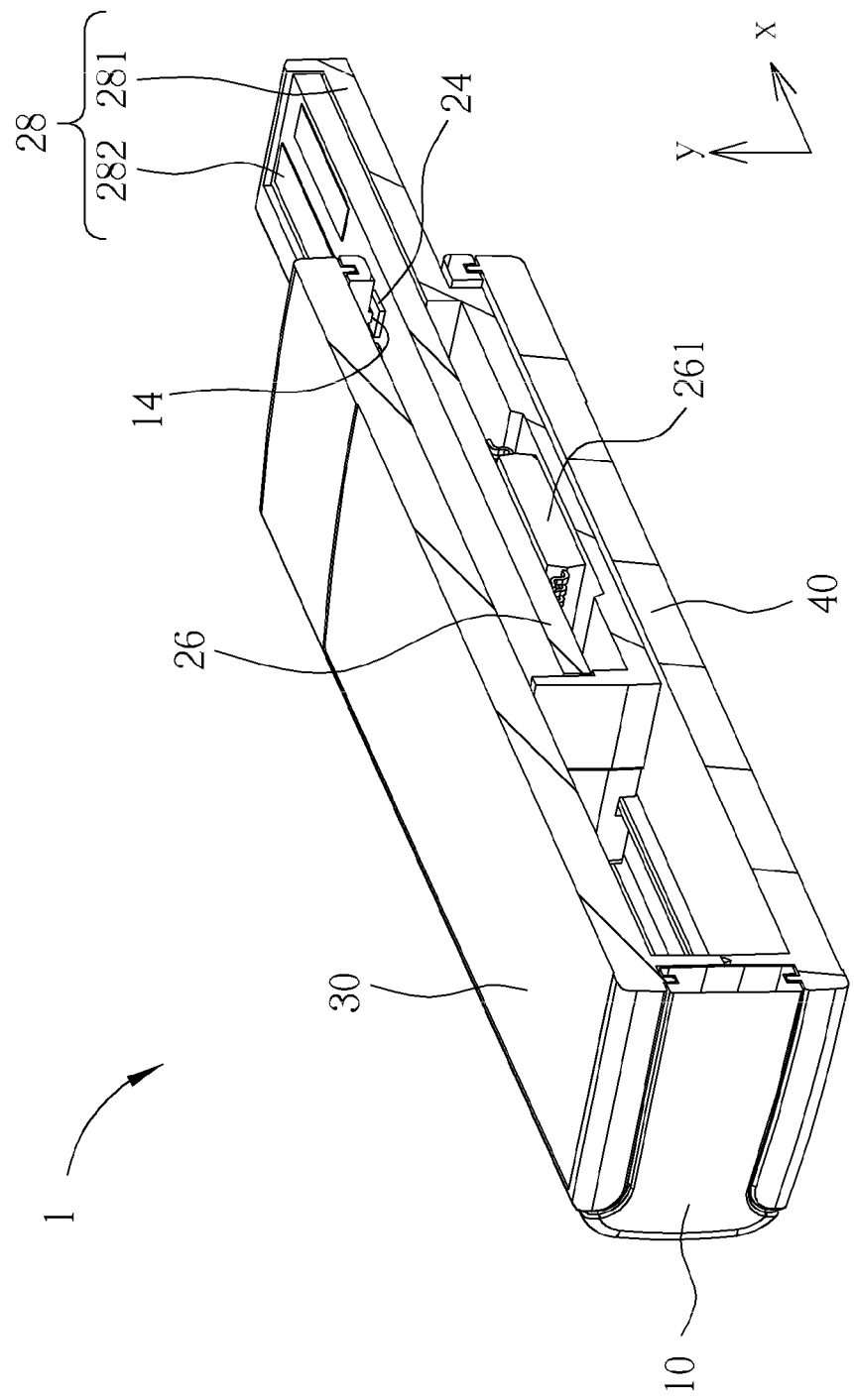
FIG. 5 is a halfly sectional view of the pen drive where the second component is moved to the extended position.
Figure 6:
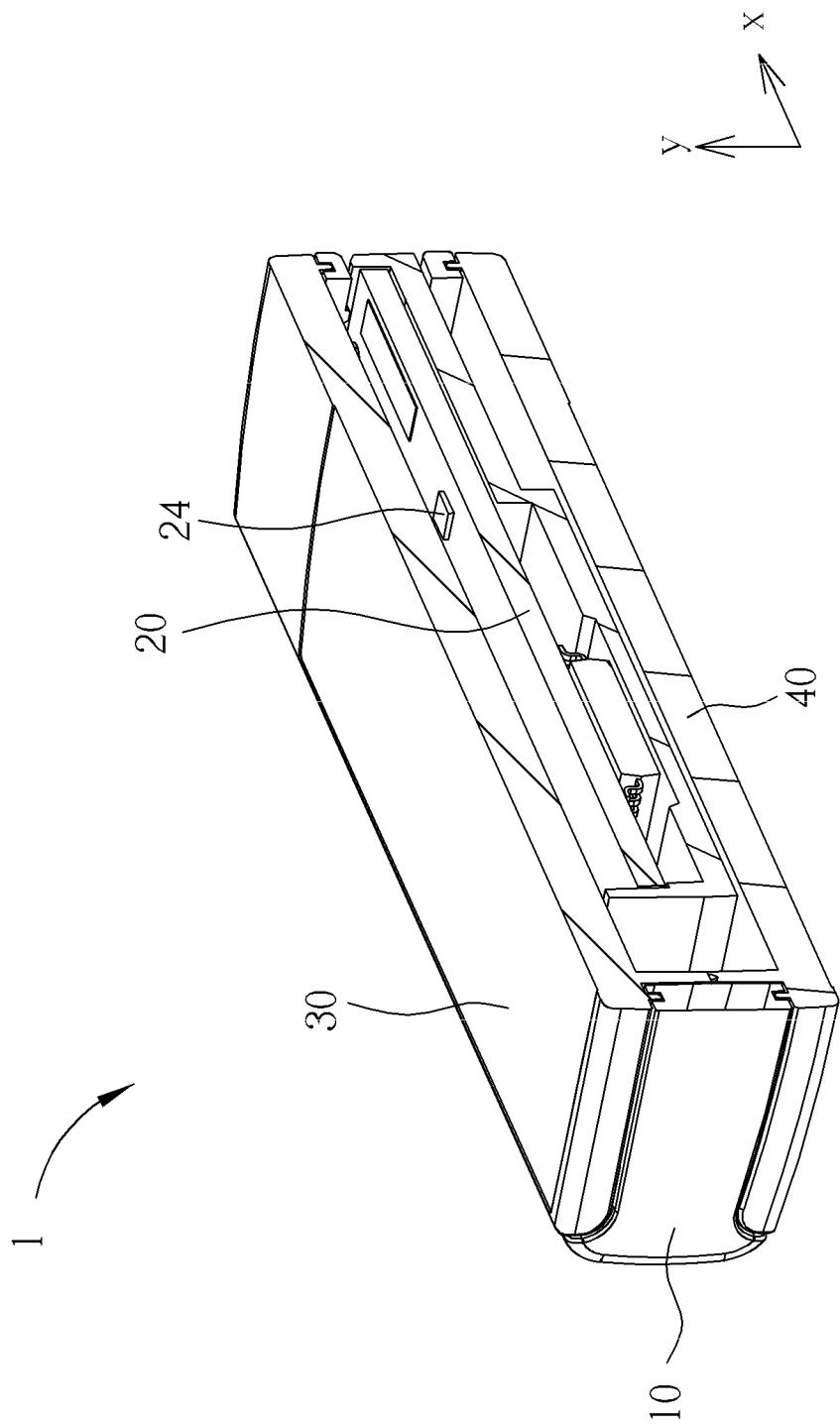
FIG. 6 is a halfly sectional view of the pen drive where the second component is move to the retracted position.

Please refer to FIG. 5 and FIG. 6. FIG. 5 is a halfly sectional view of the pen drive 1 where the second component 20 is moved to the extended position, an operatable position protruding from the opening 16 of the first component 10 and ready to be inserted into a receptacle of a host, and FIG. 6 is a halfly sectional view of the pen drive 1 where the second component 20 is move to the retracted position. Please also refer to FIG. 7 and FIG. 8 for corresponding side sectional views of FIG. 5 and FIG. 6. When the second component 20 is totally retracted into the first component 10 as shown in FIG. 6 and FIG. 8, the connector 28 of the second component 20 also retracts in the opening 16 of the first component 10 so that the pen drive 1 may have an integral and minimized size. The opening 16 of the first component 16 may be slightly larger in the dimension than the cross-section of the connector 28, or the total dimension including the bulging contacts 282 for some interface standards, which ensures some clearance between the connector 28 and the first component 10 so that the connector 28 and its contacts 282 are friction-free during the movement of the second component 20 with respect to the first component 10. Durability of the pen drive 1 is guaranteed.

Figure 7:
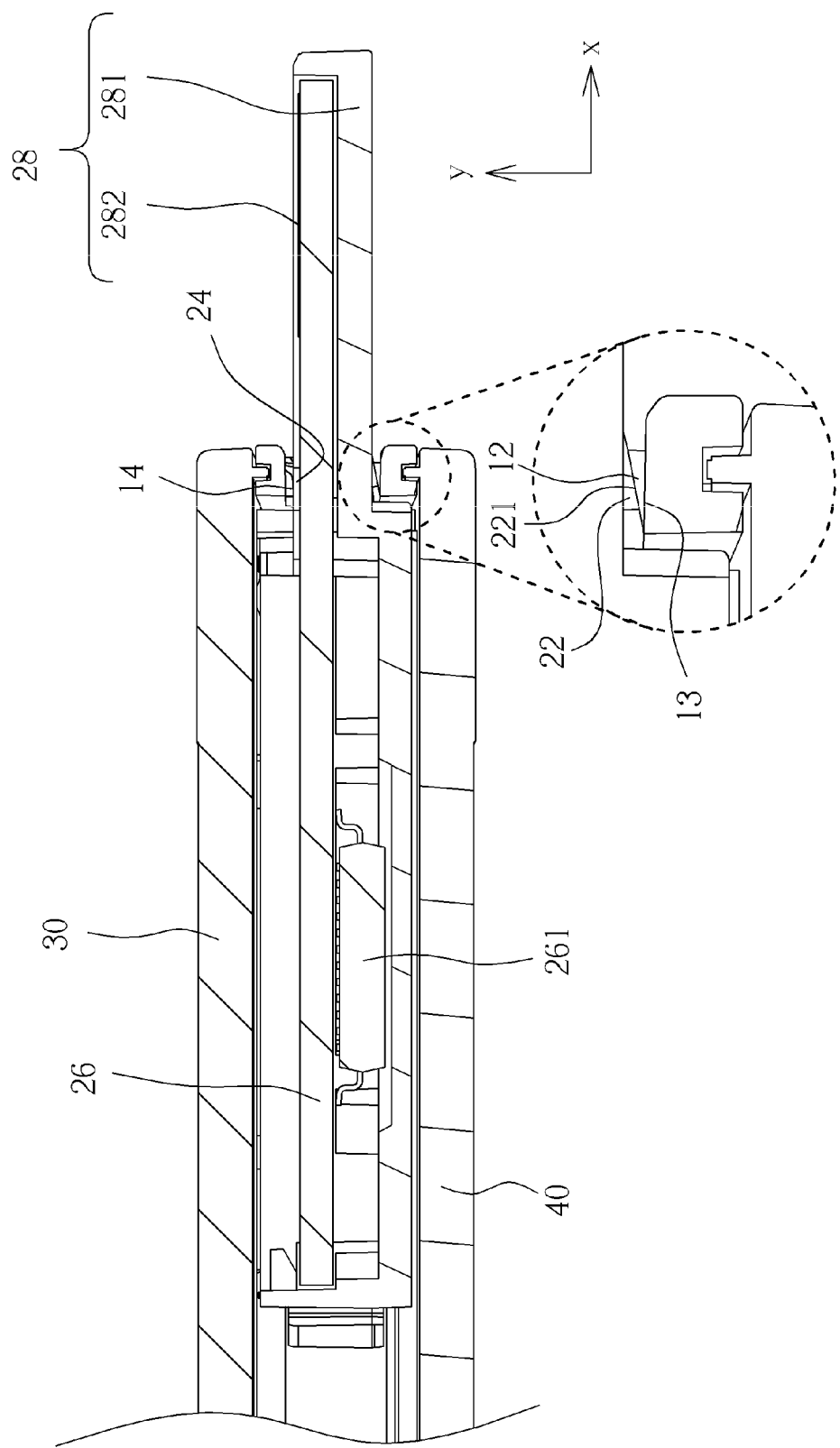
FIG. 7 is a schematic diagram of corresponding side sectional view of FIG. 5.
Figure 8:
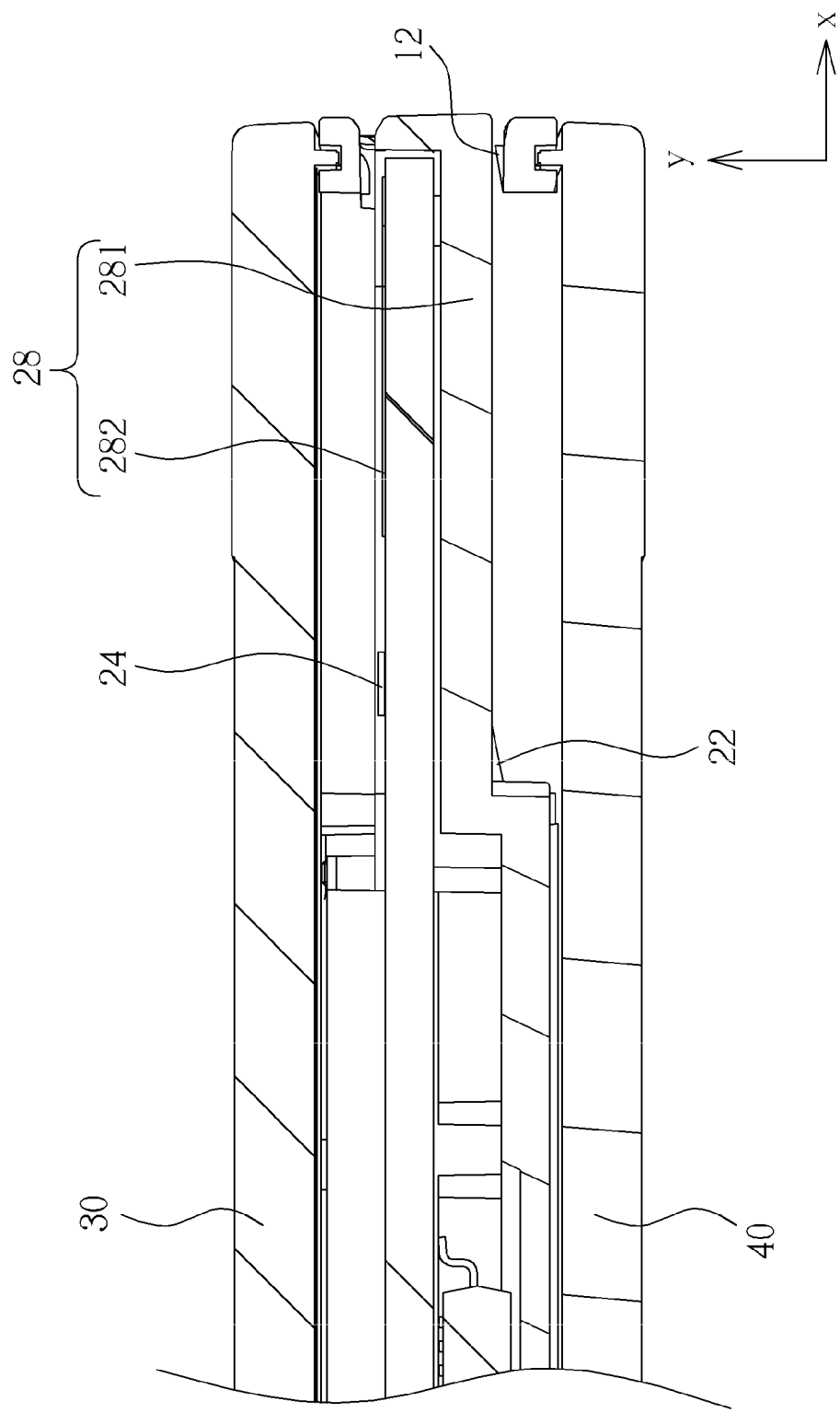
FIG. 8 is a schematic diagram of corresponding side sectional view of FIG. 6.
Figure 10:
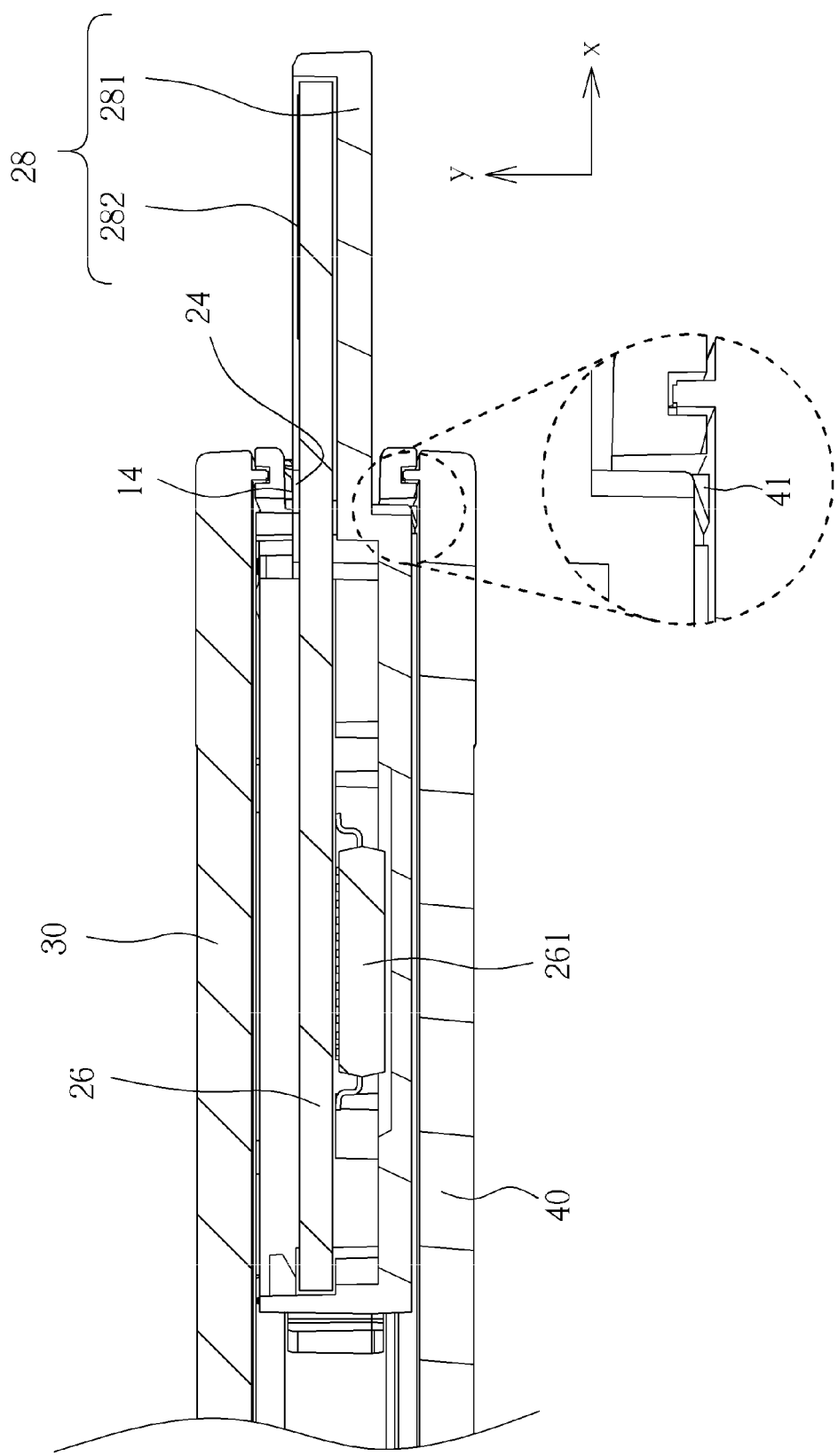
FIG. 10 is a schematic diagram of another embodiment showing the second component moved to the extended position.

Please refer to FIG. 5 and FIG. 7. Corresponding to the first biasing element 12 of the first component 10, the second component 20 includes a second biasing element 22 to be interacted with the first biasing element 12. For the embodiment shown in the figures, the second biasing element 22 is a rib with an inclined surface 221, where the first biasing element 12 is a protrusion formed on an inner wall 13 at the perimeter of the opening 16 of the first component 10. In some other embodiments of the invention, the second biasing element 22 can also be interacted directly by the inner wall 13 on the opening 16 of the first component 10, as long as the inner wall 13 has some protrusion or inclined surface or even itself that can interact with the second biasing element 22 as in the extended position. When the second component 20 slides along direction x with respect to the first component 10 all the way to the extended position as shown in FIG. 5 and FIG. 7, the second biasing element 22 is abutted by the first biasing element 12 or the inner wall 13 of the first component 10. With the orientation of the inclined surface 221 of the second biasing element 22, the second component 20 moving toward direction x causes the first biasing element 12 of the first component 10 to push the second biasing element 22 (and the second component 20) to bias upwards, or along direction y, which causes the ground nodes 24 of the circuit board 26 to be in connection with the conductive section 14 of the first component 10. The second biasing element 22 may also be deployed on somewhere else, for example, on an inner wall 41 of the bottom housing 40 and locating near the opening 16 of the first component 10 as shown in FIG. 10. The second component 20 can also be abutted by the second biasing element 22 and moved toward direction y, which causes the ground nodes 24 to be in connection with the conductive section 14. Ground pathway for ESD current is established. The connection between the ground nodes 24 and the conductive section 14 exists only when the second component 20 is moved with respect to the first component 10 to the extended position, or the operatable position as shown in FIG. 5 and FIG. 7. Once the second component 20 moves backwards along the reverse of direction x from the extended position, the second biasing element 22 is no longer abutted by the first biasing element 12, and the ground nodes 24 are no longer in connection with the conductive section 14. The clearance between the connector 26 and the first component 10 exists again. In other words, when the second component 20 is not configured at the extended position as shown in FIG. 5 and FIG. 7, which means the second component 20 is either configured at the retracted position as shown in FIG. 6 and FIG. 8 or at any intermittent position therebetween, the second biasing element 22 is not abutted by the first biasing element 12 and the clearance between the two components 10, 20 ensures the durability of the pen drive 1.

In this embodiment, direction x are perpendicular to direction y, while in other embodiments, the second component 20 moving to the extended position with respect to the first component 10 may also generate other available directions of movement caused by the interaction between the two biasing elements 12,22. The first biasing element 12 and the second biasing element 22 may also be configured at somewhere other than what is shown and disclosed in the previous embodiment. In still another embodiment, there may also be no first biasing element 12 and second biasing element 22 used in the components 10, 20. The ground nodes 24 of the circuit board 26 can be some protruding metal nodes with a certain height, but not contacting any inner wall of the first component 10 while the second component 20 is not at the extended position. Once the second component 20 is moved to the extended position, the ground nodes 24 have contact with the wall of the first component 10 at the opening 16 along direction x to establish the ground path way for the ESD issues.

While the second component 20 moves with respect to the first component 10 in a sliding way as disclosed in the previous embodiment, there may be other types of structure between the two components, such as that the second component may be rotated or rolled over with respect to the first component between a closed position and an opened position, where the connection between the ground nodes and the conductive section is only established at the opened position, or an operatable position that the pen drive is ready to insert into a receptacle of a host.

Figure 9:
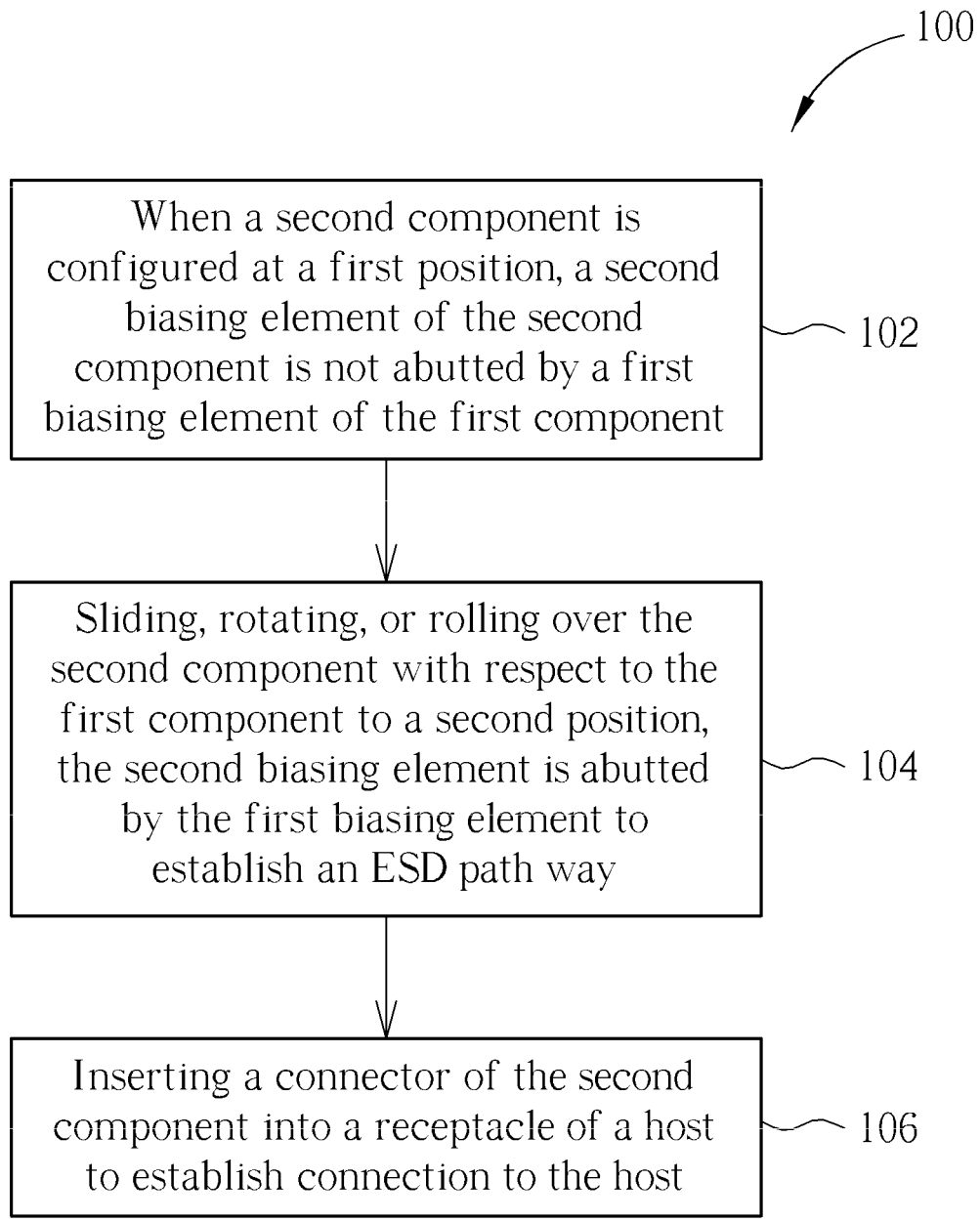
FIG. 9 is a flow chart of a method for establishing ESD protection on a removable device.

Please refer to FIG. 9, which shows a method for establishing ESD protection on a removable device. With the disclosure of a removable device, or a pen drive, a nonvolatile memory unit, any removable device with dedicated functions, the method 100 further discloses how the ESD protection can be established. The method 100 includes steps as follow:

Step 102: when a second component is configured at a first position, a second biasing element of the second component is not abutted by a first biasing element of the first component, a ground node of a circuit board of the second component is not connected with a conductive section of the first component, and clearance exists between the first component and the second component;

Step 104: sliding, rotating, or rolling over the second component along a second direction with respect to the first component to move the second component from the first position to a second position; when the second component is configured at the second position, the second biasing element is abutted by the first biasing element along a first direction to bias the second component so that the ground node has connection with the conductive section to establish an ESD path way;

Step 106: inserting a connector of the second component into a receptacle of a host to establish connection to the host and establish ESD protection.

The embodiments show that for a removable device such as a USB pen drive, two components are relatively moveable with each other by sliding, rotating, or rolling over. When the second component moves with respect to the first component, the clearance between the two components ensures durability of the removable device. As the second component moves to and is configured at an extended position, the first biasing element on the first component abuts and pushed the second biasing element on the second component so that the ground nodes of the second component contact with the conductive section of the first component. The ground path way is then established for ESD protection. As the second component moves out of the extend position, the connection between the ground nodes and the conductive section no longer exists and the clearance between the two components exists again.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A removable device utilized for inserting into a receptacle of
a host, the removable device comprising:
a first component, comprising a conductive section; and
a second component, selectively configured at a first position and a second position with respect to the first component, the second component comprising:
a biasing element for being abutted by the first component when the second component is configured at the second position with respect to the first component;
a circuit board comprising a ground node, wherein the ground node is in electrical connection with the conductive section of the first component when the biasing element is abutted by the first component to bias the second component; and
a connector having a plurality of contacts adapted to be electrically connected to the circuit board and disposed apart from the ground node, the connector inserting into the receptacle such that the removable device is operatable when the second component is configured at the second position with respect to the first component.

2. The removable device of claim 1, wherein the biasing element is not abutted by the first component and the ground node is not in connection with the conductive section when the second component is not configured at the second position with respect to the first component.

3. The removable device of claim 1, wherein the first component further comprises a first biasing element formed on an inner wall of the first component, and the biasing element is a rib with an inclined surface for being abutted by the first biasing element.

4. The removable device of claim 1, wherein the biasing element is abutted by the first component to bias the second component along a first direction when the second component moves to the second position with respect to the first component along a second direction.

5. The removable device of claim 1, wherein the connector is formed by a carrier and the plurality of contacts is disposed in the carrier.

6. The removable device of claim 5, wherein the carrier is made of plastic or a circuit on board (COB) carrier.

7. The removable device of claim 1, wherein the second component is slided, rotated, or rolled over with respect to the first component for being selectively configured at the first position and the second position.

8. The removable device of claim 1, further comprising a top housing and a bottom housing, the top housing and the bottom housing assembled together to cover around the first component.

9. The removable device of claim 1, wherein the removable device is a nonvolatile memory unit or a pen drive.

10. The removable device of claim 1, wherein the connector is a Universal Serial Bus connector.

11. A method for establishing ESD protection on a removable device, which is utilized for inserting into a receptacle of a host, the removable device comprising a first component and a second component selectively configured at a first position and a second position with respect to the first component, the method comprising steps:
moving the second component from the first position to the second position, and a biasing element of the second component being abutted by the first component to bias the second component so that a ground node of a circuit board of the second component has electrical connection with a conductive section of the first component when the second component is at the second position; and
inserting a connector having a plurality of contacts adapted to be electrically connected to the circuit board and disposed apart from the ground node of the second component into the receptacle such that the removable device is operatable when the second component is configured at the second position with respect to the first component.

12. The method of claim 11, wherein the biasing element being abutted by the first component comprises step:
biasing the second component along a first direction when the second component moves to the second position with respect to the first component along a second direction.

13. The method of claim 12, wherein the first direction is perpendicular to the second direction.

14. The method of claim 11, further comprising step:
the second component sliding, rotating, or rolling over with respect to the first component for being selectively configured at the first position and the second position.

15. The method of claim 11, further comprising step: assembling a top housing and a bottom housing together to cover around the first component.

16. The method of claim 11, further comprising step:
when the second component is moved out of the second position or to the first position, the biasing element being no longer abutted by the first component and the ground node disconnected from the conductive section.

17. A removable device, comprising:
a housing, having an opening and a conductive section around the opening; and
a removable component, movable along a direction in the housing, and comprising a connector and a set of ground nodes, the connector having a plurality of contacts disposed apart from the ground nodes that are relatively arranged to the conductive section of the housing;
wherein when the connector is protruded from the opening of the housing, the conductive section is in electrical connection with the set of ground nodes.

18. The removable device of claim 17, wherein the housing comprises:
a top housing;
a bottom housing in an opposite side of the top housing; and
a middle component disposed in-between the top housing and the bottom housing, wherein the opening is disposed at one side of the middle component.

19. The removable device of claim 18, wherein the middle component is combined with the removable component and the removable component is movable along the direction in the housing.

20. A removable device utilized for inserting into a receptacle of a host, comprising:
a housing, comprising a conductive section and a biasing element; and
a removable component, selectively configured at a first position and a second position with respect to the housing, the removable component abutted by the biasing element when configured at the second position with respect to the housing, the removable component comprising:
a circuit board comprising a ground node, wherein the ground node is in electrical connection with the conductive section of the housing when the removable component is abutted by the biasing element; and
a connector having a plurality of contacts adapted to be electrically connected to the circuit board and disposed apart from the ground node, the connector inserting into the receptacle such that the removable device is operatable when the removable component is configured at the second position with respect to the housing.

* * * * *